(12) United States Patent
Hong et al.

(10) Patent No.: US 9,899,529 B2
(45) Date of Patent: Feb. 20, 2018

(54) METHOD TO MAKE SELF-ALIGNED VERTICAL FIELD EFFECT TRANSISTOR

(71) Applicant: Samsung Electronics Co., Ltd., Suwon-si, Gyeonggi-do (KR)

(72) Inventors: Joon Goo Hong, Austin, TX (US); Borna Obradovic, Leander, TX (US); Mark Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/195,886

(22) Filed: Jun. 28, 2016

(65) Prior Publication Data
US 2017/0133513 A1 May 11, 2017

Related U.S. Application Data

(60) Provisional application No. 62/253,013, filed on Nov. 9, 2015.

(51) Int. Cl.
*H01L 21/22* (2006.01)
*H01L 29/786* (2006.01)
(Continued)

(52) U.S. Cl.
CPC .... *H01L 29/78642* (2013.01); *H01L 21/2256* (2013.01); *H01L 29/0676* (2013.01);
(Continued)

(58) Field of Classification Search
CPC .......... H01L 21/2256; H01L 29/78642; H01L 29/0676; H01L 29/42392; H01L 29/66666;
(Continued)

(56) References Cited

U.S. PATENT DOCUMENTS

| 4,960,723 A | 10/1990 | Davies |
| 5,646,058 A | 7/1997 | Taur et al. |

(Continued)

FOREIGN PATENT DOCUMENTS

KR 10-2006-0060202 6/2006

OTHER PUBLICATIONS

Sik, et al, KR Publication No. 10-2006-0060202, Published Jun. 5, 2006, as set forth above, Machine Translation.

(Continued)

*Primary Examiner* — Whitney T Moore
*Assistant Examiner* — Joseph Galvin, III
(74) *Attorney, Agent, or Firm* — Lewis Roca Rothgerber Christie LLP

(57) ABSTRACT

A method for making a self-aligned vertical nanosheet field effect transistor. A vertical trench is etched in a layered structure including a plurality of layers, using reactive ion etching, and filled, using an epitaxial process, with a vertical semiconductor nanosheet. A sacrificial layer from among the plurality of layers is etched out and replaced with a conductive (e.g., metal) gate layer coated with a high-dielectric-constant dielectric material. Two other layers from among the plurality of layers, one above and one below the gate layer, are doped, and act as dopant donors for a diffusion process that forms two PN junctions in the vertical semiconductor nanosheet.

18 Claims, 10 Drawing Sheets

(51) Int. Cl.
*H01L 29/423* (2006.01)
*H01L 29/06* (2006.01)
*H01L 29/66* (2006.01)
*H01L 21/225* (2006.01)

(52) U.S. Cl.
CPC .. *H01L 29/42392* (2013.01); *H01L 29/66666* (2013.01); *H01L 29/66772* (2013.01); *H01L 29/78618* (2013.01); *H01L 29/78654* (2013.01); *H01L 29/78696* (2013.01)

(58) Field of Classification Search
CPC ......... H01L 29/66772; H01L 29/78618; H01L 29/78654; H01L 29/78696
See application file for complete search history.

(56) References Cited

U.S. PATENT DOCUMENTS

| | | |
|---|---|---|
| 6,207,511 B1 | 3/2001 | Chapman et al. |
| 7,211,844 B2 | 5/2007 | Furukawa et al. |
| 7,230,286 B2 | 6/2007 | Cohen et al. |
| 8,647,947 B2 | 2/2014 | Masuoka et al. |
| 8,841,718 B2 | 9/2014 | Sdrulla et al. |
| 2011/0298037 A1* | 12/2011 | Choe ................ G11C 16/0483 257/324 |
| 2012/0025383 A1* | 2/2012 | Daubenspeck ... H01L 21/76852 257/762 |
| 2013/0168822 A1 | 7/2013 | Clark, Jr. et al. |
| 2014/0099748 A1 | 4/2014 | Woods et al. |
| 2014/0124864 A1* | 5/2014 | Hong ................ H01L 21/02532 257/355 |
| 2015/0243675 A1* | 8/2015 | Lim ................ H01L 27/11556 257/324 |
| 2015/0318282 A1 | 11/2015 | Rodder et al. |

OTHER PUBLICATIONS

Stutzmann, et al, Self-Aligned, Vertical-Channel Polymer Field-Effect Transistors, Science, vol. 299, Mar. 21, 2003, pp. 1881-1884.

\* cited by examiner

METHOD TO MAKE SELF-ALIGNED VERTICAL FIELD EFFECT TRANSISTOR

CROSS-REFERENCE TO RELATED APPLICATION(S)

The present application claims priority to and the benefit of U.S. Provisional Application No. 62/253,013, filed Nov. 9, 2015, entitled "METHOD TO MAKE SELF-ALIGNED VERTICAL FIELD EFFECT TRANSISTOR", the entire content of which is incorporated herein by reference.

FIELD

One or more aspects of embodiments according to the present invention relate to vertical field effect transistors, and more particularly to a method for fabricating a vertical field effect transistors using a self-aligning fabrication process.

BACKGROUND

Vertical architectures for field effect transistors may have various advantages, including increased density and performance. However, fabricating such structures with deposition, masking, and etching processes may be challenging, in part because devices made with such processes may exhibit considerable variation in gate length and spacer thickness.

Thus, there is a need for a process for fabricating vertical field effect transistors that is capable of providing good control of device parameters, such as gate length and spacer thickness.

SUMMARY

Aspects of embodiments of the present disclosure are directed toward a method for making a self-aligned vertical nanosheet field effect transistor. A vertical trench is etched in a layered structure including a plurality of layers, using reactive ion etching, and filled, using an epitaxial process, with a vertical semiconductor nanosheet. A sacrificial layer from among the plurality of layers is etched out and replaced with a gate stack comprising a gate dielectric layer (or gate dielectric layers, e.g. a dielectric interlayer and a high dielectric constant dielectric layer) and a subsequent conductive (e.g., metal) gate layer. Two other layers from among the plurality of layers, one above and one below the gate layer, are doped, and act as dopants for a diffusion process that forms two PN junctions (i.e. two doped regions on each end of a channel) in the vertical semiconductor nanosheet.

According to an embodiment of the present invention there is provided a method for fabricating a field effect transistor having a channel and a gate, the method including: depositing a plurality of layers, including a sacrificial layer, on a substrate; etching a first trench through the plurality of layers; growing a vertical semiconductor sheet, to form the channel, in the first trench; etching the sacrificial layer to form a first gap; and forming a conductive layer in the first gap, to form the gate.

In one embodiment, the sacrificial layer includes, as a major component, silicon nitride.

In one embodiment, the plurality of layers further includes: two amorphous carbon layers; two layers of undoped oxide; and two layers of doped oxide.

In one embodiment, the method includes, as a major component, silicon nitride; a second layer of undoped oxide of the two layers of undoped oxide; a second layer of doped oxide of the two layers of doped oxide; and a second amorphous carbon layer of the two amorphous carbon layers.

In one embodiment, the growing of the vertical semiconductor sheet, to form the channel, in the first trench, includes: growing the vertical semiconductor sheet to include a first dopant at a lower end of the vertical semiconductor sheet; and growing the vertical semiconductor sheet to include the first dopant at an upper end of the vertical semiconductor sheet.

In one embodiment, the method includes: heating the intermediate structure to cause the second dopant to diffuse out of the layers of doped oxide and into the vertical semiconductor sheet.

In one embodiment, the inclusion of the first dopant results in the lower end having a first conductivity type and the upper end of the vertical semiconductor sheet having the first conductivity type, and the second dopant is selected to produce, when diffused into the vertical semiconductor sheet, a semiconductor material of the first conductivity type.

In one embodiment, the thickness of the first and second layer of undoped oxide is the same, and chosen to provide a desired separation of the second dopants diffused into the vertical semiconductor sheet.

In one embodiment, the growing of the vertical semiconductor sheet, to form the channel, in the first trench produces an intermediate structure, the vertical sheet extending above an upper surface of an upper one of the two amorphous carbon layers.

In one embodiment, the method includes, after the growing of the vertical semiconductor sheet, to form the channel, in the first trench, and before the etching of the sacrificial layer to form the first gap: planarizing an upper surface of the intermediate structure utilizing chemical mechanical planarization (CMP).

In one embodiment, the method includes, after the forming of the conductive layer in the first gap, to form the gate: etching a lower one of the two amorphous carbon layers to form a second gap, etching an upper one of the two amorphous carbon layers to form a third gap, forming a lower contact layer in the second gap; and forming an upper contact layer in the third gap.

In one embodiment, the method includes: after the etching of the first trench through the plurality of layers, and before the growing of the vertical semiconductor sheet, to form the channel, in the first trench: depositing a liner of oxide; and after the etching of the lower one of the two amorphous carbon layers to form the second gap and the etching of the upper one of the two amorphous carbon layers to form the third gap, and before the forming of the lower contact layer in the second gap and the forming of the upper contact layer in the third gap: etching the liner of oxide within the second gap and within the third gap.

In one embodiment, the method includes, after the growing of the vertical semiconductor sheet, to form the channel, in the first trench, and before the forming of the conductive layer in the first gap, to form the gate: etching a lower one of the two amorphous carbon layers to form a second gap, etching an upper one of the two amorphous carbon layers to form a third gap, forming a lower contact layer in the second gap; and forming an upper contact layer in the third gap.

In one embodiment, the method includes: after the etching of the first trench through the plurality of layers, and before the growing of the vertical semiconductor sheet, to form the channel, in the first trench: depositing a liner of oxide; and after the etching of the lower one of the two amorphous carbon layers to form the second gap and the etching of the upper one of the two amorphous carbon layers to form the third gap, and before the forming of the lower contact layer in the second gap and the forming of the upper contact layer in the third gap: etching the liner of oxide within the second gap and within the third gap.

In one embodiment, the method includes, after the etching of the sacrificial layer to form the first gap; and before the forming of the conductive layer in the first gap, to form the gate: forming a dielectric layer on the surfaces of the first gap.

In one embodiment, the method includes, after the etching of the first trench through the plurality of layers, and before the growing of the vertical semiconductor sheet, to form the channel, in the first trench: depositing a liner of oxide.

In one embodiment, the method includes, after the depositing of the liner of oxide, and before the growing of the vertical semiconductor sheet, to form the channel, in the first trench: removing horizontal portions of the liner of oxide using a reactive ion etch process.

In one embodiment, the growing of the vertical semiconductor sheet, to form the channel, in the first trench, includes growing of the vertical semiconductor sheet utilizing an epitaxial process.

According to an embodiment of the present invention there is provided a microelectronic structure including: a substrate; a first conductive contact layer on the substrate; a first doped oxide layer on the first conductive contact layer; a first undoped oxide layer on the first doped oxide layer; a first dielectric layer on the first undoped oxide layer; a first conductive gate layer on the first dielectric layer; a second dielectric layer on the first conductive gate layer; a second undoped oxide layer on the second dielectric layer; a second doped oxide layer on the undoped oxide layer; a second conductive contact layer on the second doped oxide layer; a first doped silicon vertical nanosheet extending through: the second conductive contact layer; the second doped oxide layer; the second undoped oxide layer; the second dielectric layer; the first conductive gate layer; the first dielectric layer; the first undoped oxide layer; the first doped oxide layer; and the first conductive contact layer, the first conductive gate layer being separated from the first doped silicon vertical nanosheet by: a third dielectric layer, parallel to the first doped silicon vertical nanosheet, and joining the first dielectric layer and the second dielectric layer.

In one embodiment, the first doped silicon vertical nanosheet includes: a first PN junction; and a second PN junction, the first PN junction being a first distance below a lower surface of the first dielectric layer, the second PN junction being a second distance above an upper surface of the second dielectric layer, the first distance being the same as the second distance.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a method to make a self-aligned vertical field effect transistor provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
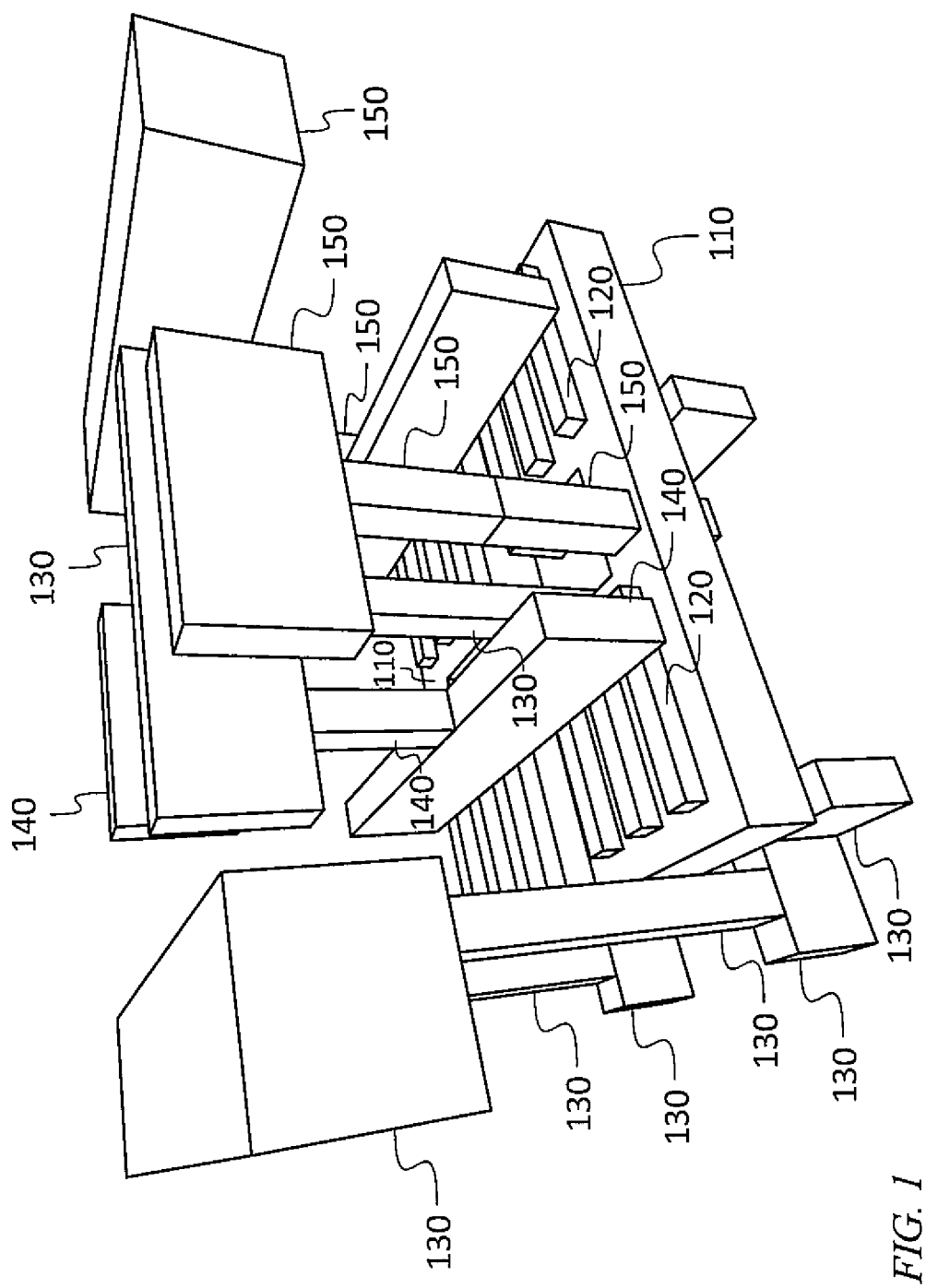
FIG. 1 is a perspective cutaway view of a vertical field effect transistor, according to an embodiment of the present invention.

Referring to FIG. 1, in one embodiment a vertical nanosheet field effect transistor includes one or more gates 110, one or more vertical channels 120, and a plurality of conductive elements forming a source contact structure 130, a drain contact structure 140, and a gate contact structure 150. Each gate 110 may wrap around a plurality of channels 120. FIG. 1 illustrates an embodiment with the drain at the upper end of each channel and the source at the lower end of each channel; in other embodiments the source is at the upper end of each channel and the drain is at the lower end of each channel. Although some embodiments relate to vertical nanosheet field effect transistors, the invention is not limited to this kind of transistor and in some embodiments is employed with other kinds of vertical field effect transistors.

Figure 2:
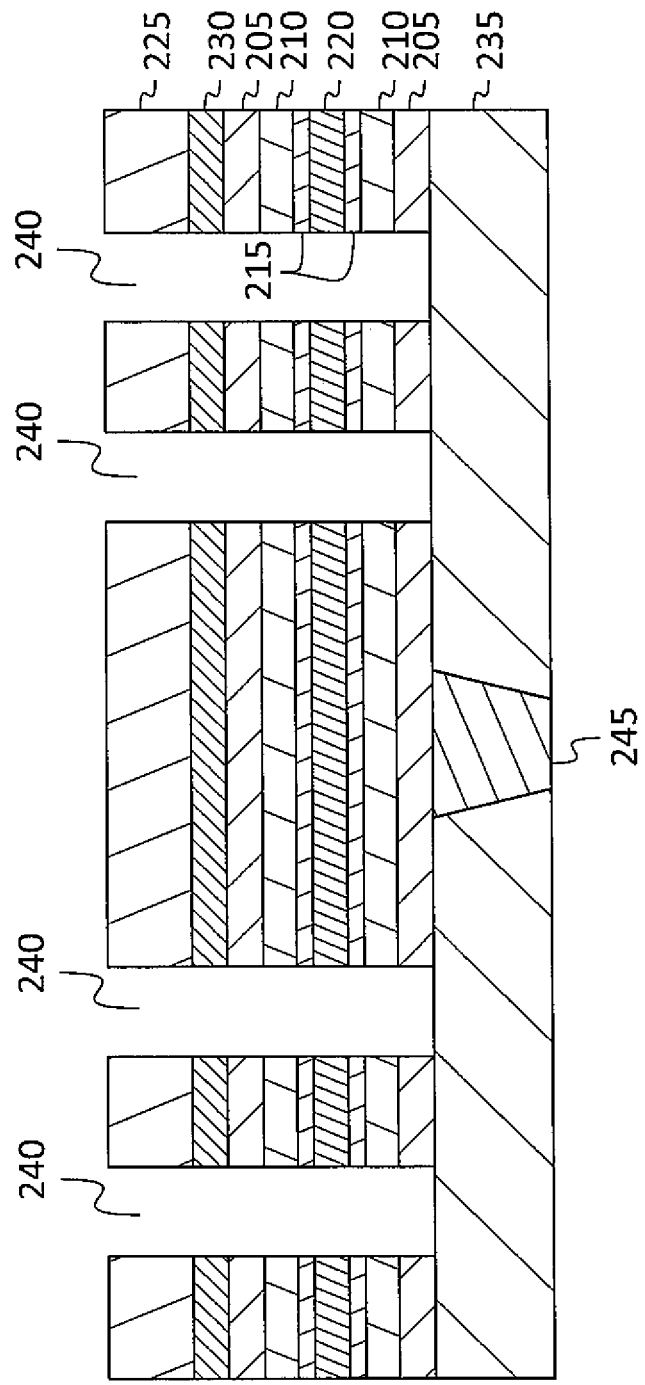
FIG. 2 is a cross sectional view of an intermediate structure formed during a process for fabricating a vertical field effect transistor, according to an embodiment of the present invention.

Referring to FIG. 2, in one embodiment an intermediate structure formed in the process of fabricating a vertical nanosheet field effect transistor includes a plurality of layers or films. The layers include two amorphous carbon layers 205, two doped oxide (e.g., silicon dioxide) layers 210, two undoped oxide layers 215, a silicon nitride (Si3N4) layer 220, a photoresist layer 225 and an antireflection coating 230. The structure of FIG. 2 may be formed by depositing the layers on a substrate 235, patterning the photoresist layer 225 and forming a plurality of trenches 240 using, for example, reactive ion etching. The substrate 235 may include one or more shallow trench isolation structures 245 (e.g., structures preventing currents from flowing laterally through the substrate 235).

Figure 3:
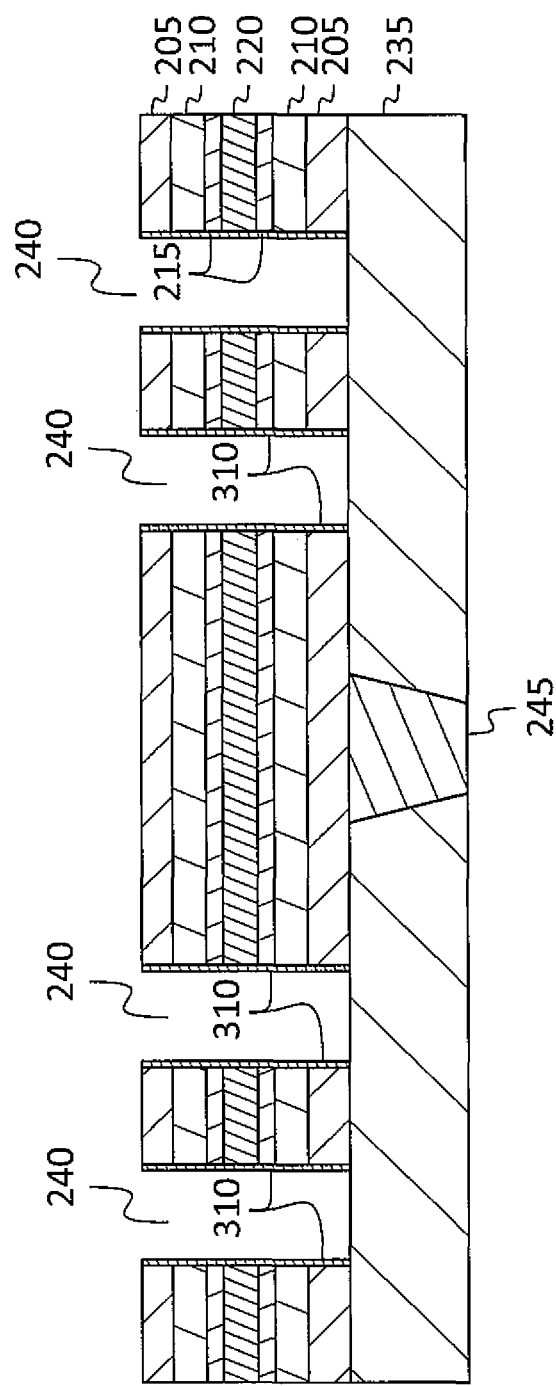
FIG. 3 is a cross sectional view of an intermediate structure formed during a process for fabricating a vertical field effect transistor, according to an embodiment of the present invention.

Referring to FIG. 3, in one embodiment an intermediate structure formed in the process of fabricating a vertical nanosheet field effect transistor is formed from the structure of FIG. 2 by removing the photoresist layer 225 and the antireflection coating 230, depositing an oxide liner or "dummy oxide" layer 310 on the resulting structure, and removing the horizontal, or "planar" portions of the oxide liner 310 (i.e., the portions at the bottoms of the trenches 240, and the portions on the upper surface of the upper one of the two amorphous carbon layers 205) using reactive ion etching. The resulting structure may then include a plurality of trenches, the walls of each trench being coated with the oxide liner 310.

Figure 4:
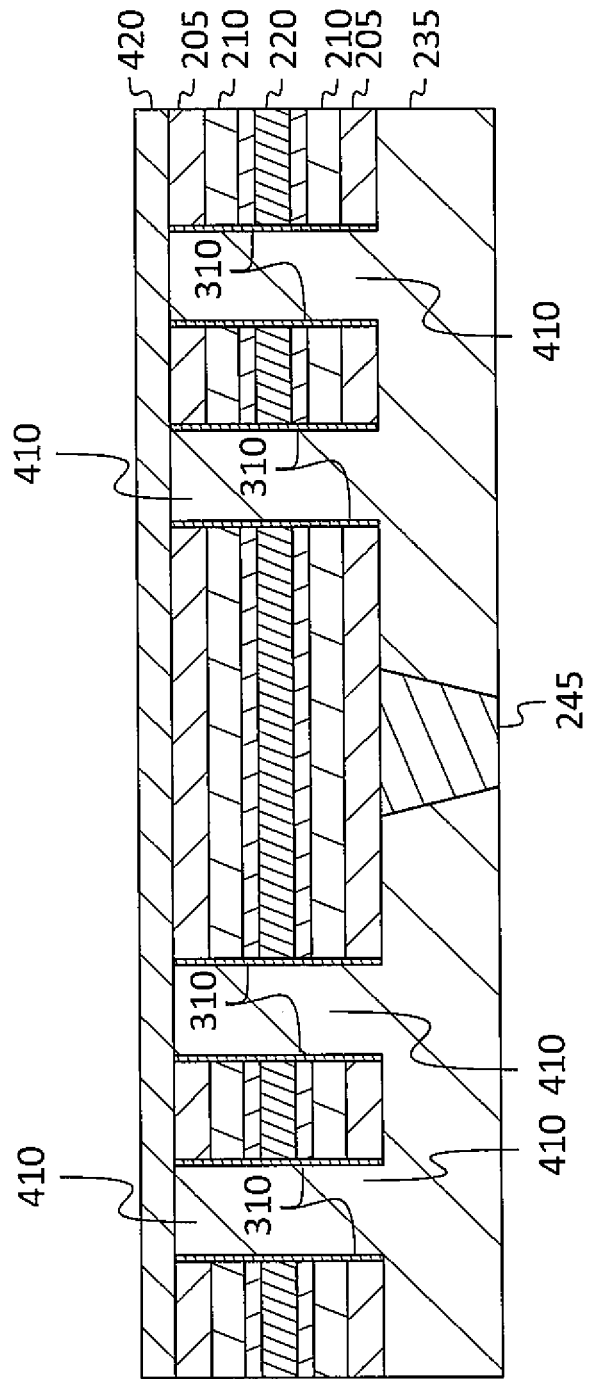
FIG. 4 is a cross sectional view of an intermediate structure formed during a process for fabricating a vertical field effect transistor, according to an embodiment of the present invention.

Referring to FIG. 4, in one embodiment vertical nanosheets 410 are then grown in the trenches 240 using an epitaxial process (e.g., vapor phase epitaxy). The growth by an epitaxial process may be continued for a sufficiently long time to "overgrow" the vertical nanosheets, i.e., to cause the vertical nanosheets to grow tall enough to extend above the top surface of the upper one of the two amorphous carbon layers 205. A chemical mechanical planarization (CMP) process may subsequently be used to planarize the top surface of the structure, so that the top surface of each of the vertical nanosheets is flush with the top surface of the upper one of the two amorphous carbon layers 205. An oxide layer 420 may then be deposited on the top surface of the structure, i.e., on the top surfaces of the vertical nanosheets and the top surface of the upper one of the two amorphous carbon layers 205. The process of growing the vertical nanosheets in the trenches 240 using an epitaxial process may result in aspect ratio trapping, a process in which any defects formed in a vertical nanosheet during an epitaxial process may tend to propagate diagonally until it terminates at a wall of the trench 240 defining the vertical nanosheet. Because the trenches 240, and, accordingly, the vertical nanosheets, may have high aspect ratios (i.e., small widths relative to their heights), the distance each may propagate before terminating may be small, and consequently the defect concentration may be low. The vertical nanosheets may be doped with a non-uniform doping profile during the epitaxial process, so that each vertical nanosheet may be, for example, heavily doped at the top and at the bottom, with the doping level decreasing toward the middle, with, for example, the central region of each vertical nanosheet being composed of intrinsic silicon.

Figure 5:
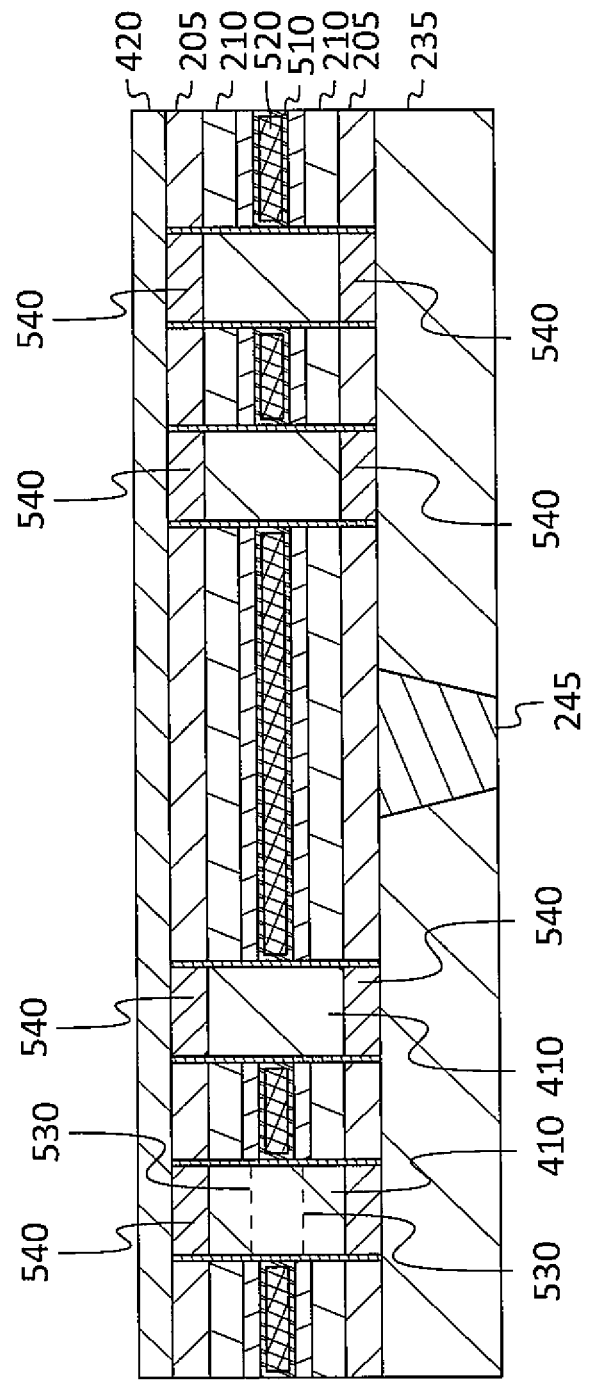
FIG. 5 is a cross sectional view of an intermediate structure formed during a process for fabricating a vertical field effect transistor, according to an embodiment of the present invention.

Referring to FIG. 5, in one embodiment, vertical channels are then formed, by (i) etching out the silicon nitride layer 220 and forming, in its place, a high dielectric constant insulating layer 510 and a gate conductor, e.g., a work function metal layer 520, and (ii) performing a diffusion process to diffuse (or "in-diffuse") dopants from the two doped oxide layers 210 into the vertical nanosheets 410, forming two PN junctions 530 in each of the vertical nanosheets 410. In some embodiments, the formation of the PN junctions by diffusion from the two doped oxide layers 210 that are initially formed over and under the two undoped oxide layers 215 enables the accurate alignment of the gate of the vertical nanosheet field effect transistor relative to the two PN junctions 530 in each channel. Accordingly, gate overlap may be reduced or eliminated, or, as illustrated in FIG. 5, negative gate overlap (or "gate underlap") may be achieved by use of appropriate thickness of the two undoped oxide layers 215 anti/or by variation of the time and temperature of the diffusion. This in turn may reduce gate induced drain leakage (GIDL) and/or increase effective channel length.

The etching out of the silicon nitride layer 220 and the forming, in its place, the high dielectric constant insulating layer 510 and the gate conductor 520 may be performed utilizing a replacement metal gate process, which may include, e.g., a selective etch followed by atomic layer deposition.

In some embodiments the vertical nanosheets 410 are doped as they are grown, with dopant concentration and/or dopant type varying during the deposition process, and the dopants of the two doped oxide (SiO2) layers 210 are selected accordingly. For example, a vertical nanosheet 410 may be grown to be heavily doped, to be of one conductivity type (i.e., n-type or p-type) at each end of the vertical nanosheet 410 (e.g. at the upper end and at the lower end, forming heavily doped regions 540), and to be more lightly doped, or undoped, or lightly doped with the opposite conductivity type, near the center of the vertical nanosheet 410. Each of the two doped oxide layers 210 may then contain the same dopant, and the dopant may be one that, when in-diffused into the vertical nanosheet 410, acts as a dopant producing the conductivity type the same as that of the heavily-doped regions 540.

For example, before the in-diffusion, the heavily-doped regions 540 of the vertical nanosheet 410 may be p-type, and the center may be intrinsic (e.g., intrinsic silicon) or lightly-doped n-type, and the dopant in the two doped oxide layers 210 may cause the vertical nanosheet 410 to further become p-type when it diffuses into the vertical nanosheet 410. In other embodiments the conductivity types may be reversed, i.e., the heavily-doped regions 540 of the vertical nanosheet 410 may be n-type, and the center may be intrinsic (e.g., intrinsic silicon) or lightly-doped p-type, and the dopant in the two doped oxide layers 210 may cause the vertical nanosheet 410 to further become n-type when it diffuses into the vertical nanosheet 410. In some embodiments the two doped oxide layers 210 contain different dopants, selected to create two regions of opposite conductivity types when the two dopants diffuse into respective regions of the vertical nanosheet 410 during the diffusion process; such an embodiment may be utilized to form a tunnel field effect transistor.

Figure 6:
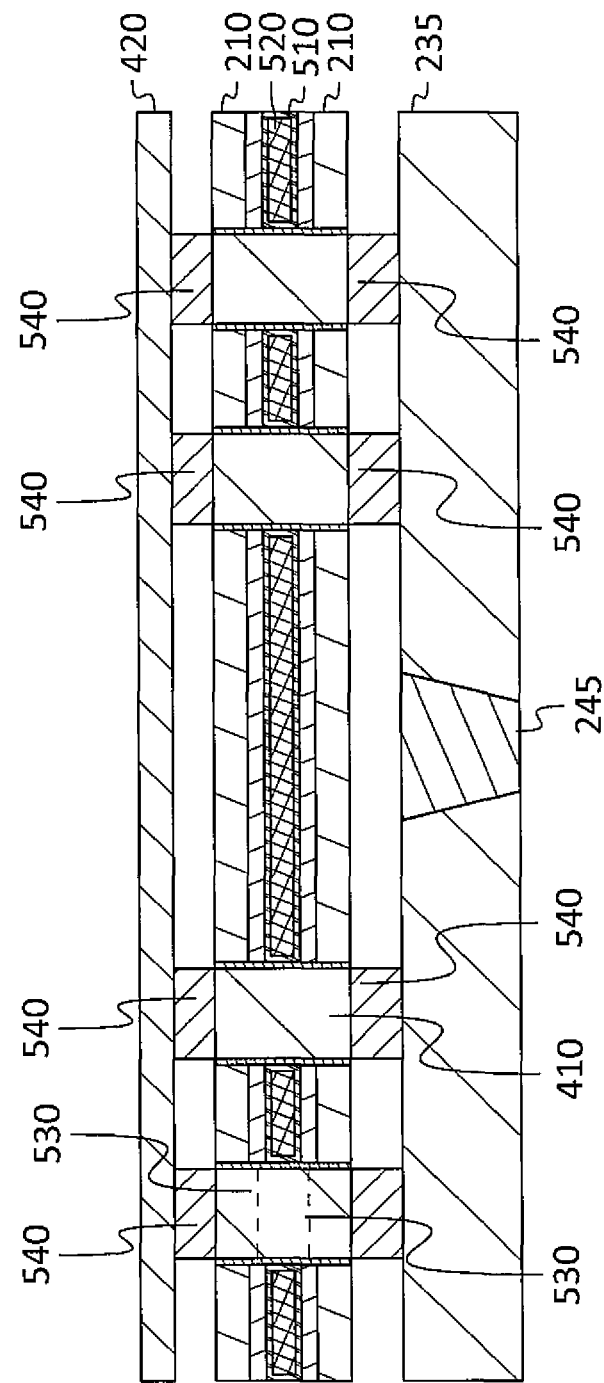
FIG. 6 is a cross sectional view of an intermediate structure formed during a process for fabricating a vertical field effect transistor, according to an embodiment of the present invention.

Referring to FIG. 6, in one embodiment, the amorphous carbon layers 205 are then etched out (e.g., using a dry etch process), and, the oxide liner 310 may be etched out (using a wet or dry etching process) at the vertical channel, e.g., in the areas where the oxide liner 310 is adjacent to one of the amorphous carbon layers 205.

Figure 7:
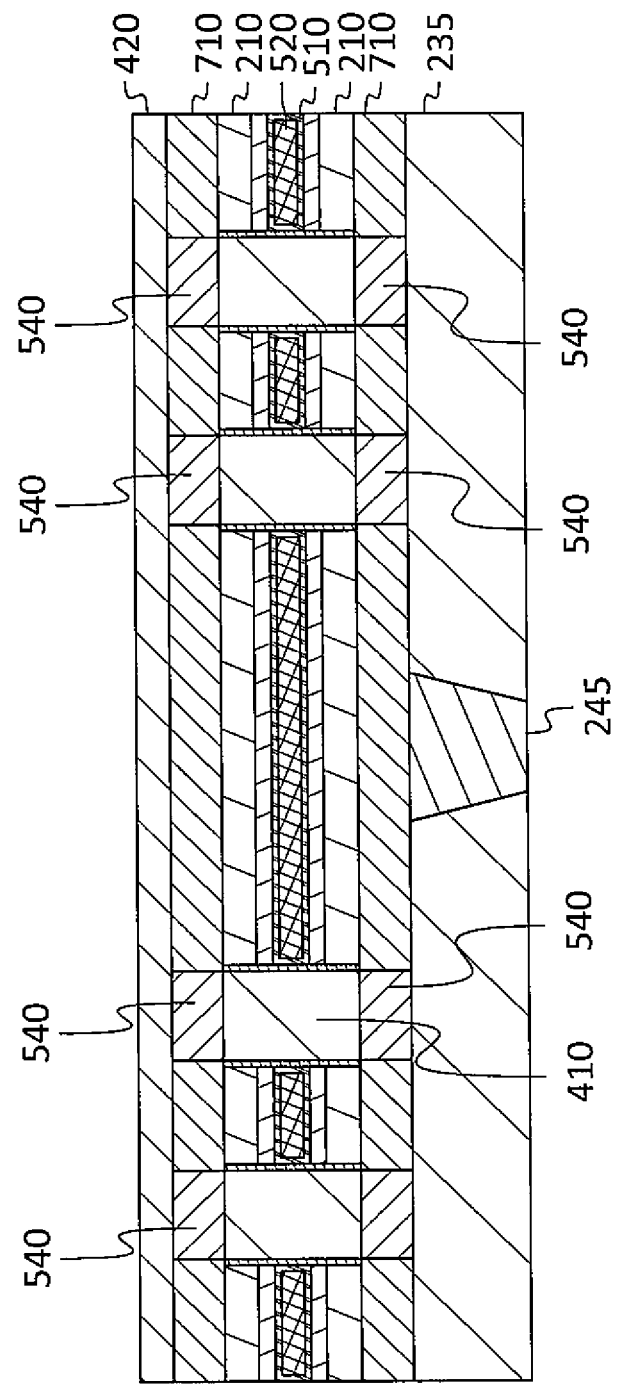
FIG. 7 is a cross sectional view of an intermediate structure formed during a process for fabricating a vertical field effect transistor, according to an embodiment of the present invention.

Referring to FIG. 7, contact layers 710 (or "source drain layers", or "source drain contact layers") are formed in the gaps resulting from the removal of the amorphous carbon layers 205. A side epitaxial fill with silicon or silicon germanium may be used to form the contact layers 710. In some embodiments the channel vertical nanosheet 410 and the contact layers 710 may instead be composed of a III-V semiconductor.

In some embodiments the processes employed to form (i) the high dielectric constant insulating layer 510 and the work function metal layer 520 and (ii) the contact layers 710 are performed in an order different from that described above. For example, beginning with the structure illustrated in FIG. 4, the amorphous carbon layers 205 may be etched out and the oxide liner 310 may be etched out at the vertical channel, and the contact layers 710 may be formed by epitaxial growth. Subsequently the silicon nitride layer 220 may be etched out, and the high dielectric constant insulating layer 510, and the work function metal layer 520, may be formed in its place.

Figure 8:
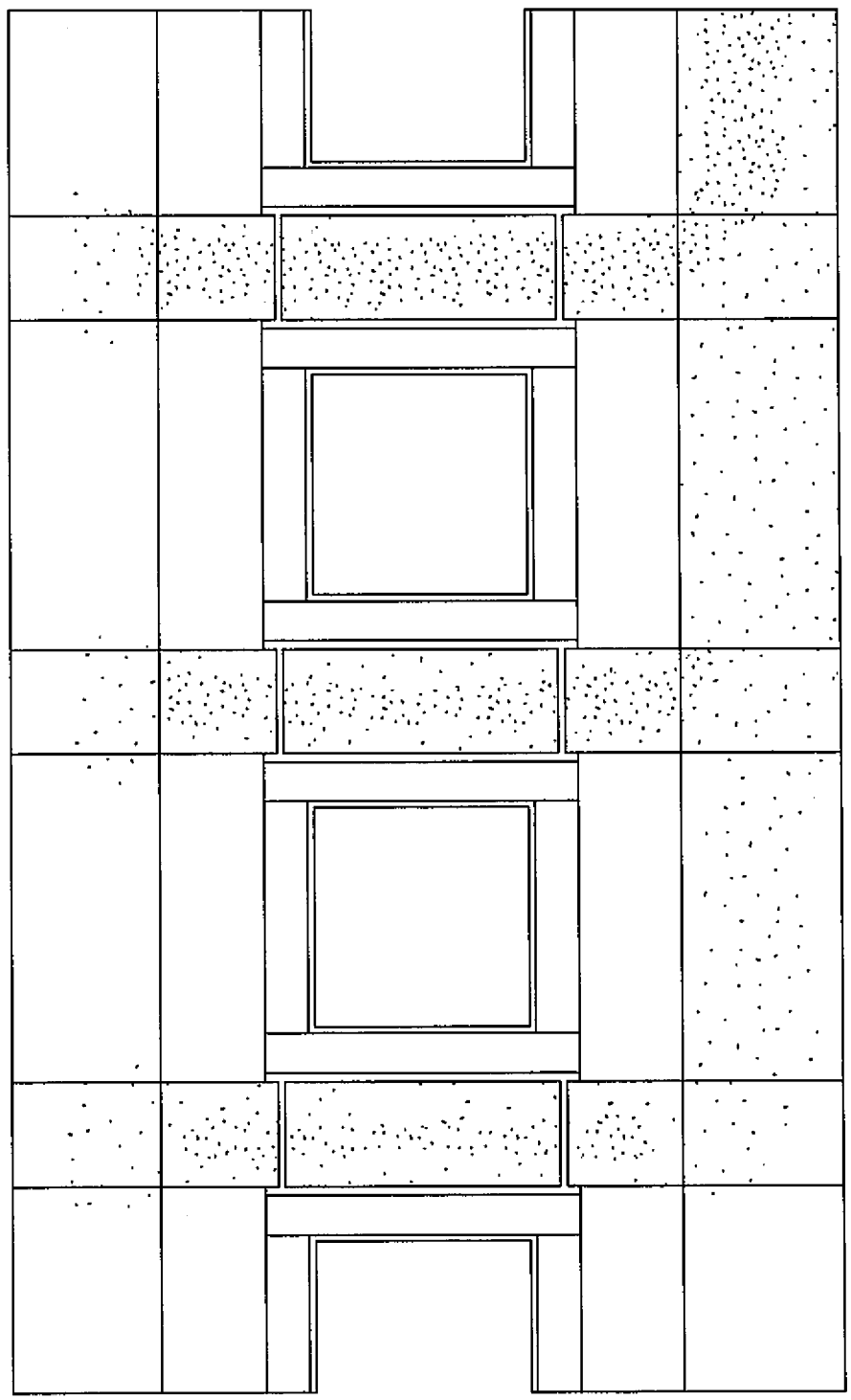
FIG. 8 is a plan view of a simulated current distribution of a vertical field effect transistor, according to an embodiment of the present invention.
Figure 9:
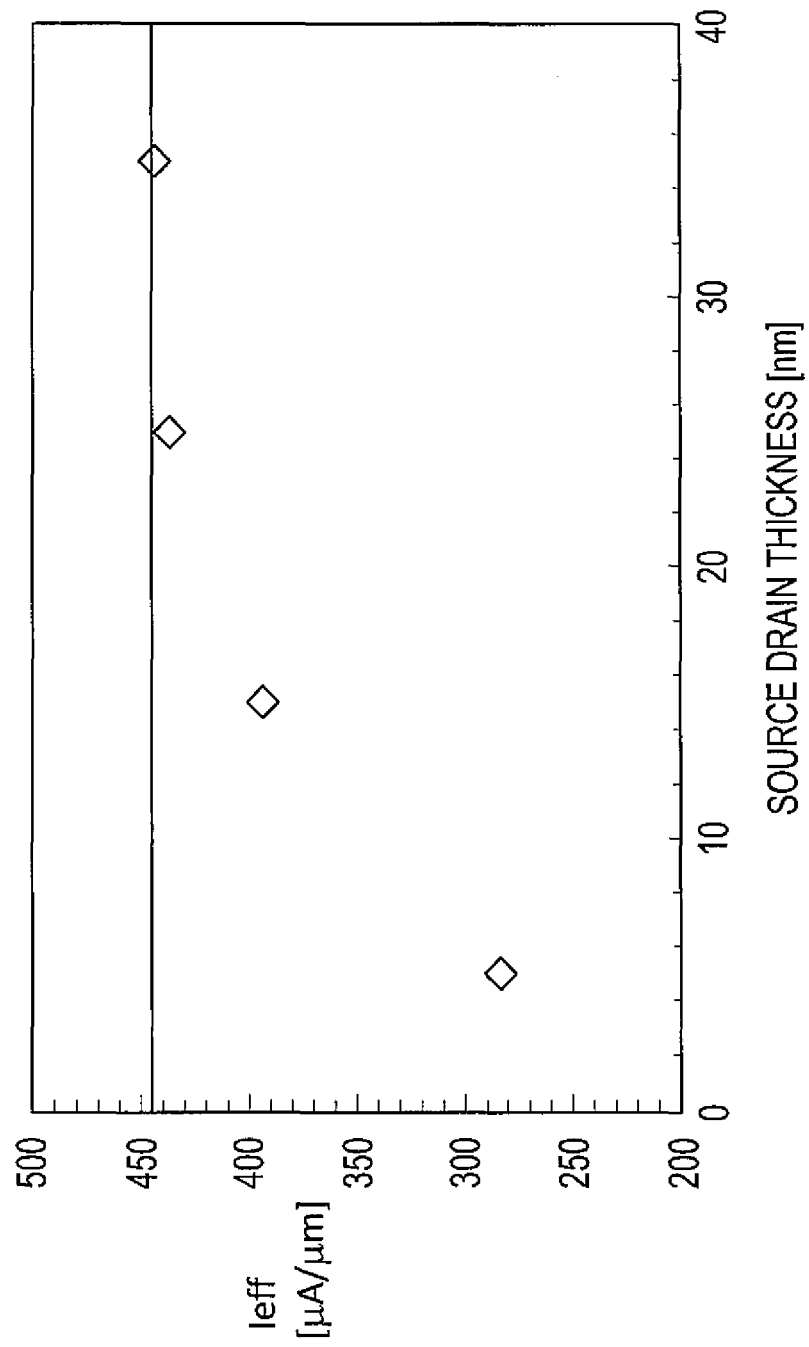
FIG. 9 is a graph of effective current as a function of source drain contact layer thickness, according to an embodiment of the present invention.

Referring to FIGS. 8 and 9, a thickness of 20 nm for the contact layers 710 may be sufficient to reduce current densities to acceptable levels. FIG. 8 is an illustration of the result of a finite element model predicting current density for a structure with a contact. The density of stippling in FIG. 8 is representative of current density, and in this example significant variation in current density is visible. FIG. 9 shows a plot of peak surface current density as a function of the thickness of the contact layers 710. As may be seen form FIG. 9, the access resistance may be acceptable for a thickness of at least 20 nm for the contact layers 710. In some embodiments the thickness of the contact layers 710 is between 20 nm and 40 nm.

Figure 10:
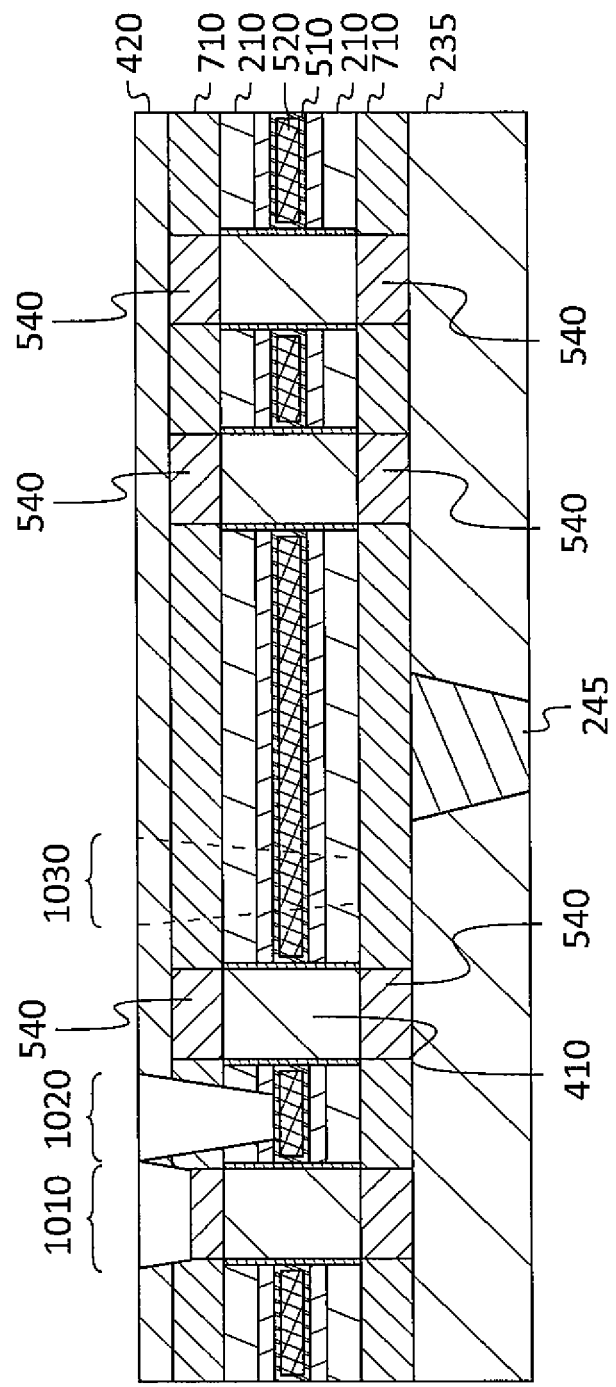
FIG. 10 is a cross sectional view of a vertical field effect transistor, according to an embodiment of the present invention.

Referring to FIG. 10, in one embodiment, a top contact 1010, a gate contact 1020, and a bottom contact 1030 are formed, with middle of line (MOL) processing. The top contact may be a source contact or a drain contact and, accordingly, the bottom contact may be a drain contact or a source contact. The bottom contact 1030 is shown in dashed lines because it may be formed out of the plane of the section, e.g., in a region of the device in which the gate layer is absent, so that the bottom contact 1030 does not short to the gate conductor 520.

In FIG. 5 and FIG. 6 the PN junctions are illustrated only in one of the vertical nanosheets 410, but they may be present in all of the vertical nanosheets 410. The regions 540 of the channel that are formed, during the growing of the vertical nanosheets 410, to be more heavily doped are shown in FIGS. 5, 6, 7, and 10 and are, for clarity, not separately illustrated in FIG. 4.

As such, aspects of embodiments of the present disclosure are directed toward a method for making a self-aligned vertical nanosheet field effect transistor. A vertical trench is etched in a layered structure including a plurality of layers, using reactive ion etching, and filled, using an epitaxial process, with a vertical semiconductor nanosheet. A sacrificial layer from among the plurality of layers is etched out and replaced with a gate stack comprising a gate dielectric layer (or gate dielectric layers, e.g. a dielectric interlayer and a high dielectric constant dielectric layer) and a subsequent conductive (e.g., metal) gate layer. Two other layers from among the plurality of layers, one above and one below the gate layer, are doped, and act as dopants for a diffusion process that forms two PN junctions in the vertical semiconductor nanosheet.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a method to make a self-aligned vertical field effect transistor have been specifically described and illustrated herein, many modifications and variations will be apparent to those skilled in the art. Accordingly, it is to be understood that a method to make a self-aligned vertical field effect transistor constructed according to principles of this invention may be embodied other than as specifically described herein. The invention is also defined in the following claims, and equivalents thereof.

What is claimed is:

1. A method for fabricating a field effect transistor having a channel and a gate, the method comprising:
    depositing a plurality of layers, including a sacrificial layer, on a substrate;
    etching a first trench through the plurality of layers;
    growing a vertical semiconductor sheet, to form the channel, in the first trench;
    etching the sacrificial layer to form a first gap; and
    forming a conductive layer in the first gap, to form the gate,
    wherein the growing comprises completely filling the first trench.

2. The method of claim 1, wherein the sacrificial layer comprises, as a major component, silicon nitride.

3. The method of claim 1, wherein the plurality of layers further comprises:
    two amorphous carbon layers;
    two layers of undoped oxide; and
    two layers of doped oxide.

4. The method of claim 3, wherein the plurality of layers comprises, in order, from the substrate:
    a first amorphous carbon layer of the two amorphous carbon layers;
    a first layer of doped oxide of the two layers of doped oxide;
    a first layer of undoped oxide of the two layers of undoped oxide;
    the sacrificial layer, comprising, as a major component, silicon nitride;
    a second layer of undoped oxide of the two layers of undoped oxide;
    a second layer of doped oxide of the two layers of doped oxide; and
    a second amorphous carbon layer of the two amorphous carbon layers.

5. A method for fabricating a field effect transistor having a channel and a gate, the method comprising:
    depositing a plurality of layers, including a sacrificial layer, on a substrate;
    etching a first trench through the plurality of layers;
    growing a vertical semiconductor sheet, to form the channel, in the first trench;
    etching the sacrificial layer to form a first gap; and
    forming a conductive layer in the first gap, to form the gate,
    wherein the plurality of layers further comprises:
        two amorphous carbon layers;
        two layers of undoped oxide; and
        two layers of doped oxide,
    wherein the growing of the vertical semiconductor sheet, to form the channel, in the first trench, comprises:
        growing the vertical semiconductor sheet to include a first dopant at a lower end of the vertical semiconductor sheet; and
        growing the vertical semiconductor sheet to include the first dopant at an upper end of the vertical semiconductor sheet.

6. The method of claim 5, wherein:
    the growing of the vertical semiconductor sheet, to form the channel, in the first trench produces an intermediate structure, and
    each of the layers of doped oxide includes a second dopant,
    the method further comprising:
    heating the intermediate structure to cause the second dopant to diffuse out of the layers of doped oxide and into the vertical semiconductor sheet.

7. The method of claim 6, wherein:
    the inclusion of the first dopant results in the lower end having a first conductivity type and the upper end of the vertical semiconductor sheet having the first conductivity type, and
    the second dopant is selected to produce, when diffused into the vertical semiconductor sheet, a semiconductor material of the first conductivity type.

8. The method of claim 7, the thickness of the first and second layer of undoped oxide being the same, and chosen to provide a desired separation of the second dopants diffused into the vertical semiconductor sheet.

9. The method of claim 3, wherein the growing of the vertical semiconductor sheet, to form the channel, in the first trench produces an intermediate structure, the vertical semiconductor sheet extending above an upper surface of an upper one of the two amorphous carbon layers.

10. The method of claim 9, further comprising, after the growing of the vertical semiconductor sheet, to form the channel, in the first trench, and before the etching of the sacrificial layer to form the first gap:
    planarizing an upper surface of the intermediate structure utilizing chemical mechanical planarization (CMP).

11. A method for fabricating a field effect transistor having a channel and a gate, the method comprising:
    depositing a plurality of layers, including a sacrificial layer, on a substrate;
    etching a first trench through the plurality of layers;
    growing a vertical semiconductor sheet, to form the channel, in the first trench;
    etching the sacrificial layer to form a first gap; and
    forming a conductive layer in the first gap, to form the gate,
    wherein the plurality of layers further comprises:
        two amorphous carbon layers;
        two layers of undoped oxide; and
        two layers of doped oxide,
    the method further comprising, after the forming of the conductive layer in the first gap, to form the gate:
        etching a lower one of the two amorphous carbon layers to form a second gap;
        etching an upper one of the two amorphous carbon layers to form a third gap;
        forming a lower contact layer in the second gap; and
        forming an upper contact layer in the third gap.

12. The method of claim 11, further comprising:
    after the etching of the first trench through the plurality of layers, and before the growing of the vertical semiconductor sheet, to form the channel, in the first trench:
        depositing a liner of oxide; and
    after the etching of the lower one of the two amorphous carbon layers to form the second gap and the etching of the upper one of the two amorphous carbon layers to form the third gap, and before the forming of the lower contact layer in the second gap and the forming of the upper contact layer in the third gap:
  etching the liner of oxide within the second gap and within the third gap.

13. The method of claim 3, further comprising, after the growing of the vertical semiconductor sheet, to form the channel, in the first trench, and before the forming of the conductive layer in the first gap, to form the gate:
  etching a lower one of the two amorphous carbon layers to form a second gap;
  etching an upper one of the two amorphous carbon layers to form a third gap;
  forming a lower contact layer in the second gap; and
  forming an upper contact layer in the third gap.

14. The method of claim 13, further comprising:
  after the etching of the first trench through the plurality of layers, and before the growing of the vertical semiconductor sheet, to form the channel, in the first trench:
    depositing a liner of oxide; and
  after the etching of the lower one of the two amorphous carbon layers to form the second gap and the etching of the upper one of the two amorphous carbon layers to form the third gap, and before the forming of the lower contact layer in the second gap and the forming of the upper contact layer in the third gap:
    etching the liner of oxide within the second gap and within the third gap.

15. The method of claim 1, further comprising, after the etching of the sacrificial layer to form the first gap; and before the forming of the conductive layer in the first gap, to form the gate:
  forming a dielectric layer on the surfaces of the first gap.

16. The method of claim 1, further comprising, after the etching of the first trench through the plurality of layers, and before the growing of the vertical semiconductor sheet, to form the channel, in the first trench:
  depositing a liner of oxide.

17. The method of claim 16, further comprising, after the depositing of the liner of oxide, and before the growing of the vertical semiconductor sheet, to form the channel, in the first trench:
  removing horizontal portions of the liner of oxide using a reactive ion etch process.

18. The method of claim 1, wherein the growing of the vertical semiconductor sheet, to form the channel, in the first trench, comprises growing of the vertical semiconductor sheet utilizing an epitaxial process.

* * * * *